United States Patent [19]

Patel et al.

[11] 4,311,926
[45] Jan. 19, 1982

[54] EMITTER COUPLED LOGIC PROGRAMMABLE LOGIC ARRAYS

[75] Inventors: Lalit Patel, Billerica; Michael Cooperman, Framingham, both of Mass.

[73] Assignee: GTE Laboratories Incorporated, Waltham, Mass.

[21] Appl. No.: 26,386

[22] Filed: Apr. 2, 1979

Related U.S. Application Data

[63] Continuation-in-part of Ser. No. 823,641, Aug. 11, 1977, abandoned.

[51] Int. Cl.³ ................ H03K 19/177; H03K 19/086
[52] U.S. Cl. .............................. 307/466; 307/299 A; 307/467; 357/46
[58] Field of Search ............ 307/203, 207, 213, 218, 307/445, 454, 455, 465–467; 364/716; 357/45, 46

[56] References Cited

U.S. PATENT DOCUMENTS

| | | | |
|---|---|---|---|
| 3,283,180 | 11/1966 | Pressman | 307/218 X |
| 3,416,003 | 12/1968 | Walker | 307/207 |
| 3,471,713 | 10/1969 | Uimari | 307/203 X |
| 3,567,965 | 3/1971 | Weinerth et al. | 357/46 X |
| 3,579,119 | 5/1971 | Yau et al. | 307/207 X |
| 3,649,844 | 3/1972 | Kroos | 307/207 X |
| 3,719,830 | 3/1973 | Ananianades | 307/207 X |
| 3,735,358 | 5/1973 | Ho | 307/218 X |
| 3,784,976 | 1/1974 | Ho | 357/46 X |
| 3,916,215 | 10/1975 | Gaskill, Jr. et al. | 307/203 |
| 3,925,684 | 12/1975 | Gaskill, Jr. et al. | 307/207 X |
| 4,032,894 | 6/1977 | Williams | 307/207 X |
| 4,165,470 | 8/1979 | Fulkerson | 357/46 X |

OTHER PUBLICATIONS

Millman et al., "Pulse, Digital, and Switching Waveforms"; pp. 312–317, McGraw-Hill Book Co.; 1965.
Cavaliere et al., *IBM Technical Disclosure Bulletin*; vol. 13, No. 5, pp. 1072–1073; 10/1970.
Cavaliere et al., *IBM Technical Disclosure Bulletin*; vol. 18, No. 10, pp. 3245–3248; 3/1976.
Wiedmann, *IBM Technical Disclosure Bulletin*; vol. 15, No. 1, p. 289–290; 6/1972.

*Primary Examiner*—Larry N. Anagnos
*Attorney, Agent, or Firm*—Fred Fisher

[57] ABSTRACT

Programmable logic arrays can be formed utilizing emitter coupled logic. Input terminals and control terminals associated with a programmable logic array module are coupled to the input terminals of a predetermined set of OR circuit means within the module. The outputs of the OR circuit means are coupled to various input terminals of a number of AND gates within the module. The outputs of the AND gates are coupled respectively to output terminals associated with the programmable logic array. The OR circuit means and the AND gates are coupled together in an emitter coupled logic format.

5 Claims, 7 Drawing Figures

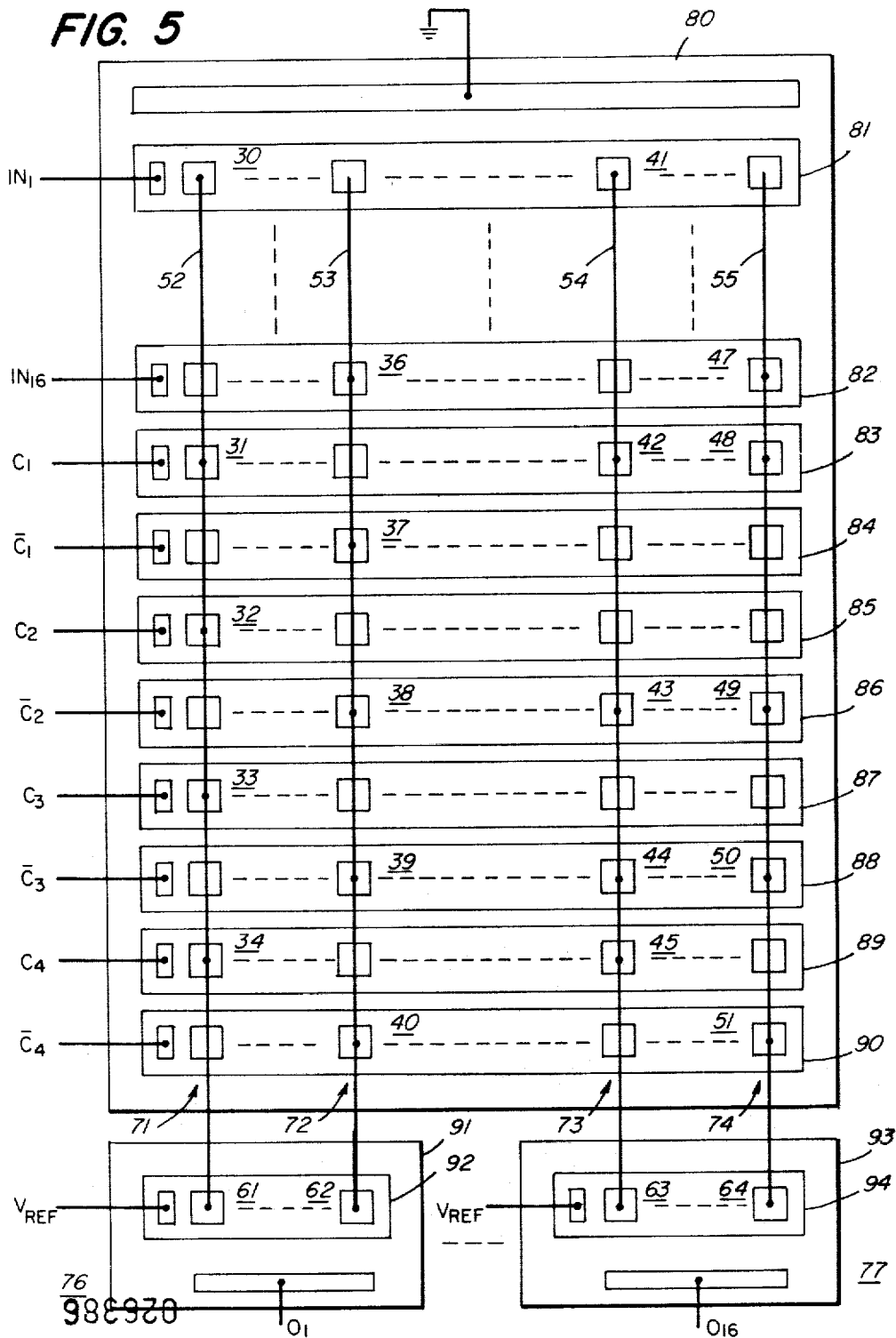

EMITTER COUPLED LOGIC PROGRAMMABLE LOGIC ARRAYS

CROSS-REFERENCE TO RELATED APPLICATION

This application is a continuation-in-part of application Ser. No. 823,641, filed Aug. 11, 1977, now abandoned.

BACKGROUND OF THE INVENTION

This invention relates to programmable logic arrays and, in particular, to emitter coupled logic programmable logic arrays. Accordingly, it is a general object of this invention to provide new and improved arrays of such character.

In the past, programmable logic arrays were TTL in character. That is, they utilized transistor to transistor logic. Such prior art arrays were obtained by using AND OR circuits, wherein the outputs of AND gates fed OR circuits in the configuration. A further description of a prior art TTL programmable logic array is set forth hereinafter following the Brief Description of the Drawings.

Emitter coupled logic circuits which perform simple logic functions, in general, are known. Because the transistors are operated in the nonsaturating mode, emitter coupled logic is capable of extremely high speed operation. A universal logic gate utilizing emitter coupled logic was disclosed in U.S. Pat. No. 3,925,684 issued Dec. 9, 1975 to Gaskill, Jr. et al. Various Logic functions could be performed by varying the external connections to one or more universal logic gates. Programmable logic arrays were disclosed by Cavaliere et al in "Current Switch Read-Only Programmable Logic Array"; *IBM Technical Disclosure Bulletin*; Vol. 18, No. 10, pp. 3245-3248; March 1976. The arrays shown therein included two complete transistor arrays. Array logic for a read only memory was disclosed in U.S. Pat. No. 3,735,358 issued May 22, 1973 to Ho.

It is desirable to construct a multi-element programmable logic array in a monolithic integrated circuit utilizing emitter coupled logic in order to simultaneously obtain high packaging density and high operating speed. To achieve high packaging density, array elements of minimum area are required. The implementation of arrays using emitter coupled logic requires a circuit having a regular structure. Since the same circuit is repeated many times in an array, the circuit utilized requires not only minimum area, but also must lend itself to simple interconnection.

SUMMARY OF THE INVENTION

Another object of this invention is to provide a new and improved programmable logic array utilizing a combination of OR circuits which are coupled to the inputs of a plurality of AND gates.

Yet another object of this invention is to provide a new and improved emitter coupled logic programmable logic array utilizing a plurality of OR circuits which are coupled to feed the inputs of a number of AND gates.

Still another object of this invention is to provide a new and improved emitter coupled logic programmable logic array which can be created using a single integrated circuit chip module.

In accordance with the present invention these and other objects and advantages are achieved in a programmable logic array in a monolithic integrated circuit. The programmable logic array includes an OR gate array, a plurality of AND gates, a first plurality of input terminals, a second plurality of control terminals, and a third plurality of output terminals.

The OR gate array includes a plurality of OR gates in which each of said OR gates comprises a number of transistors. Each of said transistors has a base which is an input to said OR gate, a collector coupled directly to a first reference potential, and an emitter. The emitters of a particular OR gate are selectively coupled together, so as to program said programmable logic array for a particular application, and are coupled to a current source to form the output of said particular OR gate.

Each of said AND gates comprises a number of transistors. Each transistor has an emitter which is coupled to one of said OR gate outputs, a base for coupling to a second reference potential, and a collector. Each of the AND gate collectors is coupled together to form the output of said AND gate.

The first plurality of input terminals is coupled to a first group of inputs of said OR gates. The second plurality of control terminals is coupled to a second group of inputs of said OR gates. The third plurality of output terminals is coupled to the outputs of said AND gates.

BRIEF DESCRIPTIONS OF THE DRAWINGS

FIG. 1b is a schematic diagram of a plurality of AND gates feeding a single OR circuit which drives a single output terminal, which schematic diagram is known prior art, for use in the TTL programmable logic array shown in FIG. 1a;

FIG. 2b is a schematic diagram of a plurality of OR circuits which feed a single AND circuit which drives a single output terminal, for use in the emitter coupled logic programmable logic array depicted in FIG. 2a;

FIG. 5 is a partial layout of a programmable logic array integrated circuit according to the present invention.

For a better understanding of the present invention, together with other and further objects, advantages, features and capabilities thereof, together with its construction and mode of operation, reference is made to the following disclosure and appended claims in connection with the abovedescribed drawings.

DESCRIPTION OF A CONVENTIONAL PROGRAMMABLE LOGIC ARRAY

Figure 1A:
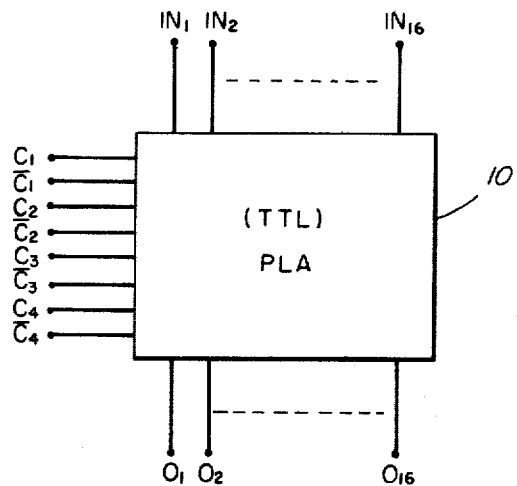
FIG. 1a is a block diagram of a TTL (transistor to transistor logic) programmable logic array in accordance with the prior art.

As prior art, FIG. 1a depicts a block diagram of a conventional programmable logic array 10, which, as an example, has 16 inputs $IN_1 IN_2 \ldots IN_{16}$ and 16 outputs $O_1 O_1 \ldots O_{16}$. The array 10 further includes a plurality of control inputs, e.g., four, which are carried on eight different lines to show the presence or absence of a control signal. Thus, in the embodiment shown in FIG. 1a, the various eight lines contain control signals $C_1$, $\overline{C}_1$, $C_2$, $\overline{C}_2$, $C_3$, $\overline{C}_3$, $C_4$, and $\overline{C}_4$.

Figure 1B:
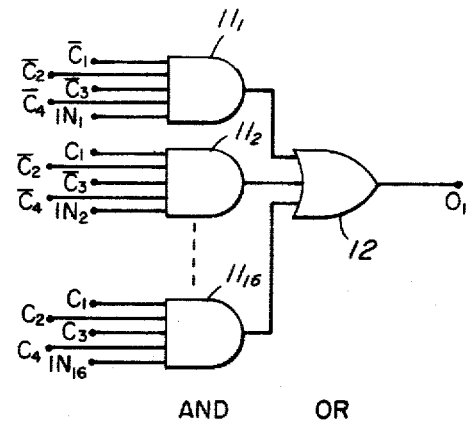

Normally, in the industry, it has been the practice that a programmable logic array be formed with TTL circuitry (transistor to transistor logic) which is realized by using a plurality of AND gates to feed a single OR circuit, such as for example, the AND gates $11_1$, $11_2$ and $11_{16}$ which feed the OR circuit 12 as depicted in FIG. 1b. The various C inputs select one or more of the inputs $IN_1$ through $IN_{16}$ which appear at the output. For example, as depicted in FIG. 1b, $\overline{C}_1$, $\overline{C}_2$, $\overline{C}_3$, $\overline{C}_4$ and $IN_1$ are coupled to the inputs of the AND gate $11_1$; control signal $C_1$, $\overline{C}_2$, $\overline{C}_3$, $\overline{C}_4$ and the input signal $IN_2$ are coupled to the inputs of the AND gate $11_2$; and control signals $C_1$, $C_2$, $C_3$, $C_4$ and the input signal $IN_{16}$ are coupled to the inputs of the AND gate $11_{16}$. The outputs of the AND gates $11_1$, $11_2$, . . . $11_{16}$ are coupled to the inputs of the OR circuit 12 whose output is coupled to the output terminal $O_1$. Thus, the output $O_1$ is the sum of the products term, as shown in the Boolean algebraic expression as shown below.

$$O_1 = \overline{C}_1 \cdot \overline{C}_2 \cdot \overline{C}_3 \cdot \overline{C}_4 \cdot IN_1 + C_1 \cdot \overline{C}_2 \cdot \overline{C}_3 \cdot \overline{C}_4 \cdot IN_2 + \ldots + C_1 \cdot C_2 \cdot C_3 \cdot C_4 \cdot IN_{16}$$

DESCRIPTION OF THE PREFERRED EMBODIMENT

Figure 2A:
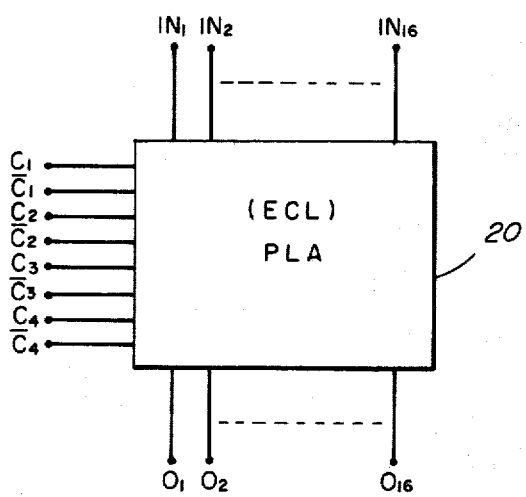
FIG. 2a is a block diagram of an ECL (emitter coupled logic) programmable logic array in accordance with one embodiment of the invention.

Referring to FIG. 2a, there is depicted a programmable logic array 20 which is formed with emitter controlled logic. The emitter controlled logic programmable logic array 20 includes a plurality of input terminals $IN_1$, $IN_2$, . . . $IN_{16}$ and a plurality of output terminals $O_1$, $O_2$, . . . $O_{16}$ together with control inputs $C_1$, $\overline{C}_1$, $C_2$, $\overline{C}_2$, $C_3$, $\overline{C}_3$, $C_4$, and $\overline{C}_4$. The ECL programmable logic array 20 can be formed on a single module using integrated chip techniques.

Figure 2B:
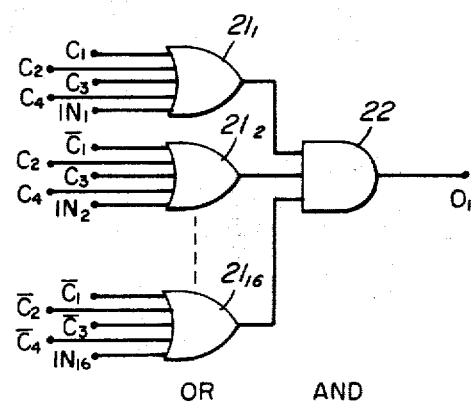

The programmable logic array 20 of FIG. 2a, utilizing emitter controlled logic, utilizes a plurality of OR circuits for feeding various AND gates. For example, as depicted in FIG. 2b, there is shown a plurality of OR circuits $21_1$, $21_2$, . . . $21_{16}$. The outputs of the various OR circuits $21_1$, $21_2$, . . . $21_{16}$ feed the inputs of an AND gate 22 whose output is coupled to the output terminal $O_1$. Various control signals and input signals are coupled to the inputs of the OR circuits. For example, as depicted in FIG. 2b, the control signals $C_1$, $C_2$, $C_3$, $C_4$ and the input signal $IN_1$ are coupled to the inputs of the OR circuit $21_1$. The control signals $\overline{C}_1$, $C_2$, $C_3$, $C_4$ and the input signal $IN_2$ are coupled to the inputs of the OR circuit $21_2$; and the control signals $\overline{C}_1$, $\overline{C}_2$, $\overline{C}_3$, $\overline{C}_4$ and the input signal $IN_{16}$ are coupled to the inputs of the OR circuit $21_{16}$. The output $O_1$ is given by the Boolean algebraic expression below.

$$O_1 = (C_1 + C_2 + C_3 + C_4 + IN_1)$$
$$(\overline{C}_1 + C_2 + C_3 + C_4 + IN_2) \ldots$$
$$(\overline{C}_1 + \overline{C}_2 + \overline{C}_3 + \overline{C}_4 + IN_{16})$$

Figure 3:
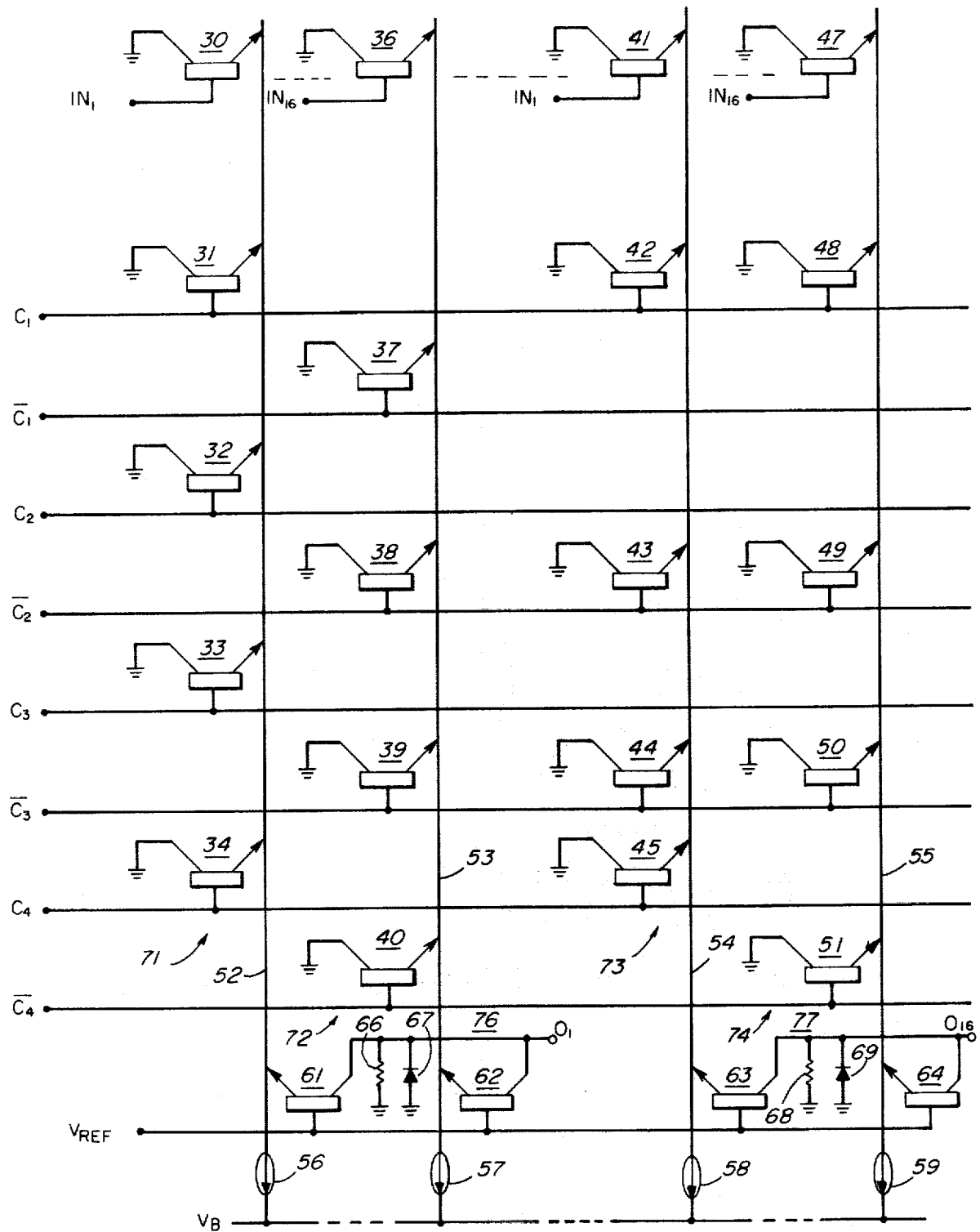
FIG. 3 is an equivalent diagram of a plurality of OR circuits for driving various AND gates for use in the block diagram of FIG. 2a, the equivalent diagram of FIG. 3 showing a plurality of transistors which could be formed on an integrated circuit chip.

A generalized schematic of the programmable logic array is depicted in FIG. 3. The schematic is shown in broken line format and deletes those portions of the module including $IN_2$ through $IN_{15}$, inclusive.

If desired, various ones of the transistors depicted in FIG. 3 can be open circuited by suitable means, such as, for example, etching the selected transistor in the integrated circuit chip so as to open circuit the transistor. Alternatively, various input leads to such transistor can be open circuited by known techniques, as by etching or by laser application.

Referring to FIG. 3, the input signal $IN_1$ is applied to the base of a p-type transistor 30. The control signal $C_1$ is coupled to the base of a p-type transistor 31. The control signal $C_2$ is applied to the base of a p-type transistor 32. The control signal $C_3$ is applied to the base of a p-type transistor 33. The control signal $C_4$ is applied to the base of a p-type transistor 34.

In similar fashion, the various inputs $IN_2$ through $IN_{15}$, inclusive, are coupled to bases of various p-type transistors. Various combinations of control signals are applied to the bases of the various transistors. The input signal $IN_{16}$ is applied to the base of a p-type transistor 36. The control signal $\overline{C}_1$ is applied to the base of a p-type transistor 37. The control signal $\overline{C}_2$ is applied to the base of a p-type transistor 38. The control signal $C_3$ is applied to the base of a p-type transistor 39. The control signal $\overline{C}_4$ is applied to the base of a p-type transistor 40.

Also, in a different coded arrangement, the input signal $IN_1$ is applied to the base of a p-type transistor 41; the control signal $C_1$ is applied to the base of a p-type transistor 42; the control signal $\overline{C}_2$ is applied to the base of a p-type transistor 43; the control signal $\overline{C}_3$ is applied to the base of a p-type transistor 44; and the control signal $C_4$ is coupled to the base of a p-type transistor 45. Further, the input signal $IN_{16}$ is coupled to the base of a p-type transistor 47; the control signal $C_1$ is applied to the base of a p-type transistor 48; the control signal $\overline{C}_2$ is applied to the base of a p-type transistor 49; the control signal $\overline{C}_3$ is applied to the base of a p-type transistor 50; and a control signal $\overline{C}_4$ is applied to the base of a p-type transistor 51.

The collectors of all the foregoing transistors 30–51, inclusive, are coupled to a point of reference potential, such as ground. The emitters of the p-type transistors 30–34 are coupled together via a common line 52. The emitters of the transistors 36–40 are coupled together via a common line 53. In similar fashion, the emitters of the transistors 41–45 are coupled together along a common line 54, and the emitters of the transistors 47–51 are coupled together along a common line 55.

The line 52 is coupled via a constant current source 56 to a constant voltage source $V_B$, which may, for example, be $-4$ volts. In similar fashion, the line 53 is coupled through a constant current source 57 to the voltage source $V_B$. Similarly, the line 54 is coupled through a constant current source 58 to the voltage source $V_B$, and the line 55 is coupled through the constant current source 59 to the voltage source $V_B$.

In a preferred mode of the invention, the constant current sources 56, 57, 58, 59 can be resistors.

A reference voltage $V_{REF}$, which may be, for example, $-1.2$ volts is coupled to the bases of p-type transistors 61, 62, 63, 64. The emitter of the transistor 61 is coupled to the line 52. The emitter of the transistor 62 is supplied to the line 53. The emitter of the transistor 63 is coupled to the line 54, and the emitter of the transistor 64 is coupled to the line 55.

The collectors of the transistors 61, 62 are coupled together to the output terminal $O_1$, whereas the collectors of the transistors 63, 64 are coupled to the output terminal $O_{16}$.

A resistor 66 couples the collectors of the transistors 61, 62 to a point of reference potential, such as ground. The cathode of a diode 67 is coupled to the collectors of the transistors 61, 62, the anode of the diode 67 being coupled to a point of reference potential such as ground. In similar fashion, a resistor 68 couples the collectors of the transistors 63, 64 to a point of reference potential such as ground, and the cathode of a diode 69 is coupled to the collectors of the transistors 63, 64. The anode of the diode 69 is coupled to a point of reference potential, such as ground.

The transistors 30-34 form an OR circuit 71. The transistors 36-40 form an OR circuit 72. The transistors 41-45 form an OR circuit 73, and the transistors 47-51 form an OR circuit 74.

The transistors 61, 62 form an AND gate 76, whereas the transistors 63, 64 form an AND gate 77.

Thus, the OR circuit 71 (including the transistors 30-34) and the OR circuit 72 (including the transistors 36-40) are coupled to feed the inputs of the AND gate 76 (comprising the transistors 61, 62).

Likewise, the OR circuit 73 (comprising the transistors 41-45) and the OR circuit 74 (comprising the transistors 47-51) are coupled to the inputs of the AND gate 77 (which comprise the transistors 63, 64).

Figure 4:
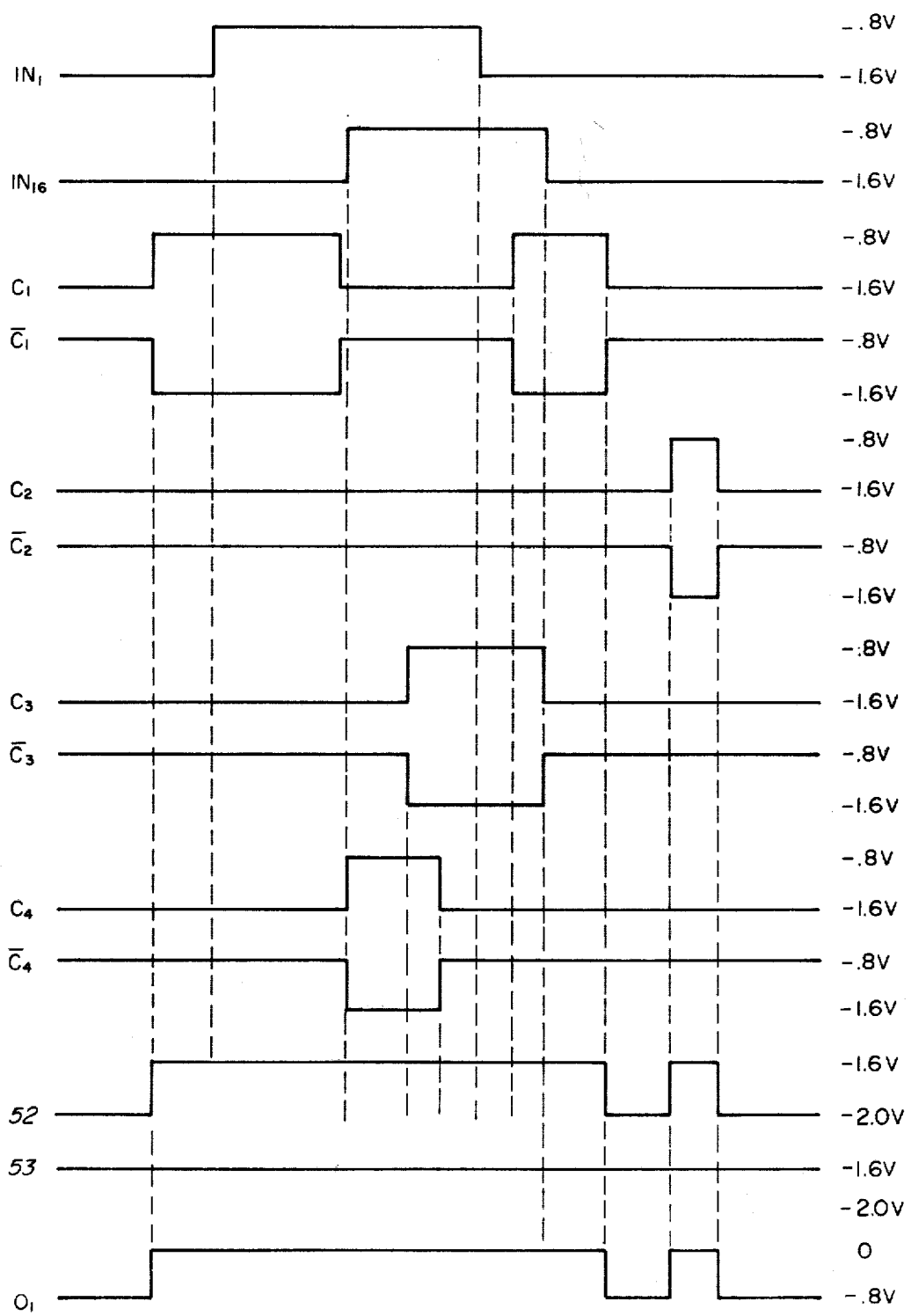
FIG. 4 is a set of waveforms helpful for understanding the operation of one embodiment of this invention.

To illustrate the efficacy and truth of the OR circuits and AND gates hereinabove described, reference is made to FIG. 4 which shows a plurality of exemplary waveforms occurring at various points on the circuit shown in FIG. 3. Referring to FIG. 4, assume that the input signals $IN_1$, $IN_{16}$ and the control signals $C_1$, $\overline{C}_1$, $C_2$, $\overline{C}_2$, $C_3$, $\overline{C}_3$, $C_4$, $\overline{C}_4$ vary between a low level of $-1.6$ volts and a high level of $-0.8$ volts. For purposes of explanation, as shown in FIG. 4, the signals $IN_1$, $IN_{16}$ may occur at different times or at overlapping times. The control signals $C_1$ and $\overline{C}_1$ are complementary in that when one is high, the other is low, and visa versa. Likewise, the control signals $C_2$ and $\overline{C}_2$ are high and low, or low and high, respectively. Likewise, control signals $C_3$ and $\overline{C}_3$ are high and low, or low and high, respectively, and the control signals $C_4$ and $\overline{C}_4$ are high and low, or low and high, respectively. The various signals occurring on the control lines $C_1$, $C_2$, $C_3$, $C_4$ may or may not be occurring simultaneously, but occur when so desired. The voltage on the line 52 represents an OR output from the OR circuit 71.

Assume that the voltage levels (i.e., $IN_1$, $C_1$, $C_2$, $C_3$, $C_4$) applied to the bases of the transistors 30-34 are all at their low state (i.e., at $-1.6$ volts) so that the transistors 30-34 do not conduct. Thus, the voltage on the line 52 tends to be low, due to the $V_B$ level of $-4.0$ volts being applied to the constant current source. Since the line 52 is coupled to the emitter of the transistor 61, and the base of the transistor 61 is maintained at $V_{REF}$ (i.e., at $-1.2$ volts), the transistor 61 conducts. Conduction therethrough provides approximately a 0.8 voltage drop across the base and emitter of the transistor 61, so that the voltage at the line 52 is held at $-2.0$ volts. Due to the conduction, the collector of the transistor 61 becomes negative due to the current flowing from the point of reference (i.e., ground) through the parallel connected resistor 66 and diode 67, through the transistor 61 to the line 52. Hence, a voltage drop of 0.8 volt occurs across the resistor 66, determined by the voltage drop across the diode 67. Hence, when the input signal $IN_1$ and the control signals $C_1$, $C_2$, $C_3$, $C_4$ are all low, the output of the OR circuit 52 remains low and the output on the output line $O_1$ remains low.

In a similar fashion, when $IN_{16}$ and $\overline{C}_1$, $\overline{C}_2$, $\overline{C}_3$, $\overline{C}_4$ are all low, the voltage on the line 53 would be at a low level at $-2.0$ volts. With the voltage on the line 53 being low, the transistor 62 conducts, causing a voltage drop across the diode 67, and causing the output on the output line $O_1$ to remain low at $-0.8$ volt.

When one of the lines 52, 53 is high and the other is low, one of the transistors 61, 62 conducts whereby the output on the line $O_1$ remains at the low state of $-0.8$ volt. However, when both the outputs on the lines 52 and 53 are high, due to the presence of a signal at the inputs of each of the OR circuits 71, 72, then both AND gate transistors 61, 62 are caused to cease conduction, and the output signal on the output terminal $O_1$ rises to ground or 0 volt.

The reason why the transistors 61, 62 turn off becomes apparent as follows. Suppose, for example, that a high signal is applied to the terminal $IN_1$, as for example, a $-0.8$ volt signal. The $-0.8$ volt signal (more positive than the low $-1.6$ volt signal) causes conduction to occur through the transistor 30, whereby the line 52 tends to rise from $-2.0$ volts to $-1.6$ volts. This occurs because the voltage drop across the transistor 30 during conduction is 0.8 volts. With the base voltage at $-0.8$ volts, the emitter voltage drops to $-1.6$ volts. In a similar fashion, when control signal $\overline{C}_1$ is applied to the base of the transistor 37 at a high value (such as $-0.8$ volt) to turn on the transistor 37, the voltage at the line 53 rises to $-1.6$ volts, causing the transistor 62 to turn off. With the voltage applied to the emitters of the transistors 61, 62 being each $-1.6$ volts and the reference voltage applied to the bases of these transistors 61, 62 being only $-1.2$ volts, the voltage differential of only 0.4 volt is insufficient to turn either of the transistors 61, 62 into conduction. Hence, since the transistors 61, 62 do not conduct, the voltage at the collectors of the transistors 61, 62 are clamped to the point of reference potential, such as ground, so that the voltage level becomes 0 volts.

Referring to FIG. 4, it is noted that the voltage at the line 52 becomes high at $-1.6$ volts when either the signal $IN_1$ is high, or when the signal at $C_1$ is high, or when the signal at $C_2$ is high, or when the signal at $C_3$ is high, or when the signal at $C_4$ is high; it will be low at all other times. Such characteristic is readily apparent from a view of FIG. 4. In similar fashion, the voltage level at line 53 becomes high when either the signal $IN_{16}$ is high, or when the signal $\overline{C}_1$ is high, or when the signal $\overline{C}_2$ is high, or when the signal $\overline{C}_3$ is high, or when the signal $\overline{C}_4$ is high; it will be low at other times. In the example given in FIG. 4, the voltage level at the line 53 is continuously high because either one or more of the input signals to the OR circuit 72 was high at all times. The voltage level at the output of the AND gates 76 (i.e., at the output line $O_1$) is high when both the lines 52, 53 are high, as is readily apparent from a view of FIG. 4.

FIG. 5 illustrates a typical integrated circuit embodiment of the circuit shown in FIG. 3. The transistors forming OR circuits 71, 72, 73 and 74 and other various OR circuits are included in an OR circuit array. Since all transistors in the OR circuit array have a common collector connection to circuit ground, it is possible to fabricate the array using a single collector region 80 which is connected to circuit ground or other suitable reference potential. All base and emitter regions for the OR circuit array are disposed in collector region 80. Since the inputs to the OR circuit array are frequently common to several OR circuits, a single elongated base region is utilized for each input. In FIG. 5, base regions 81, 82, 83, 84, 85, 86, 87, 88, 89, and 90 are disposed in collector region 80 and are connected to inputs $IN_1$, $IN_{16}$, $C_1$, $\overline{C}_1$, $C_2$, $\overline{C}_2$, $C_3$, $\overline{C}_3$, $C_4$, and $\overline{C}_4$, respectively. A single elongated base region thus provides the input to a plurality of OR circuits. Since the elongated base regions 81–90 have an appreciable resistance, it is frequently necessary to place several base connections along the length of each base region to avoid excessive resistive voltage drop in the base region material. Individual emitter regions corresponding to each transistor in the array are disposed in base regions 81–90. In FIG. 5 the transistors 30–34, 36–40, 41–45, and 47–51 are indicated by the correspondingly numbered emitter regions which, with the underlying collector and base, make up each complete transistor. The emitters of transistors 30–34, 36–40, 41–45, and 47–51 are coupled together as previously described, to form the output of each OR circuit. Other various emitter regions are disposed in base regions 81–90 to provide the programmable feature of the present invention. The Boolean algebraic expression for the function of the array can be changed by coupling other emitter regions to conductive lines 52–55. Only one configuration out of possible thousands is shown in FIG. 5.

Materials used for the various transistor regions, doping levels, and photolithographic masking and etching methods are well known in the art of fabricating monolithic high speed bipolar digital integrated circuits. For example, the entire array can be fabricated on a p-type substrate. Next an N+ region is diffused into the substrate to form a subcollector region. An N region deposited over the N+ region forms the collector. A plurality of p-type diffusions in the collector region forms the elongated base regions. An N type diffusion over a suitable mask forms a plurality of emitter regions in each base region. Contacts are formed by diffusions of N+ regions.

The transistors forming each of the AND gates 76 and 77 and other various AND gates have common collector connections within each AND gate. Therefore, AND gate 76 is fabricated with a single collector region 91 coupled to output $O_1$ and a single base region 92 coupled to reference voltage $V_{REF}$. Individual emitter regions corresponding to transistors 61 and 62 are disposed in base region 92. The emitters of transistors 61 and 62 are coupled to the outputs of OR circuits 71 and 72, respectively. Also, AND gate 77 is fabricated with a single collector region 93 coupled to output $O_{16}$ and a single base region 94 coupled to reference voltage $V_{REF}$. Individual emitter regions corresponding to transistors 63 and 64 are disposed in base region 94. The emitters of transistors 63 and 64 are coupled to the outputs of OR circuits 73 and 74, respectively.

Current sources 56–59, shown in the circuit of FIG. 3, have not been shown in FIG. 5. Similarly, resistors 66 and 68 and diodes 67 and 69, shown in the circuit of FIG. 3, have been omitted from FIG. 5. These elements are included in an actual embodiment of the present invention and are fabricated according to well known techniques.

The symmetry and simplicity of the circuit according to the present invention results in significant advantages in circuit layout in integrated circuit form. As discussed above, the OR circuit array section of the programmable logic array is formed with a single collector region and a plurality of base regions which are common to all OR circuits. Also, each AND gate of the programmable logic array is formed with a single collector region and a single base portion. When this configuration is compared with prior art programmable logic arrays, a considerable savings in integrated circuit area is realized. Prior art circuits which utilized common collectors only within each OR circuit and which utilized individual AND gate collectors required approximately four times the integrated circuit area of the present invention. In the prior art each of the collector regions requires isolation from other collector regions and must be enlarged to accommodate individual base regions and base input contacts. Smaller integrated circuit area results not only in lower cost and a higher yield rate, but also in higher reliability.

An additional feature of the present invention is a reduction of delay time through the elements of the array. The OR circuits and AND gates each introduce a one transistor delay between the input and the output of the programmable logic array. Prior art arrays have been more complex and thus have introduced a greater delay between input and output.

While there has been shown and described what is at present considered the preferred embodiment of the invention, it will be obvious to those skilled in the art that various changes and modifications may be made therein without departing from the scope of the invention as defined by the appended claims. For example, equivalent circuitry can be provided utilizing pnp-type transistors instead of npn-type transistors. Further, in lieu of conventional transistors utilizing collector, base and emitter electrodes, other types of transistors utilizing source, gate and drain electrodes can be substituted therefore. It is further to be understood that, utilizing integrated circuits, various combinations can be provided utilizing a common substrate to achieve equivalent results.

What is claimed is:

1. A programmable logic array in a monolithic integrated circuit, said array comprising:
   an OR gate array including a plurality of OR gates, each of said OR gates comprising a number of transistors, each having a base which is an input to said OR gate, a collector coupled directly to a first reference potential, and an emitter, the transistor emitters in each OR gate being selectively coupled to an output thereof, so as to program said programmable logic array, and to a current source, the transistors in said OR gate array being fabricated with one collector region, a plurality of base regions disposed in said collector region such that each base region is common to every OR gate, and a plurality of emitter regions disposed in each of said base regions such that each base region includes one emitter region per OR gate;
   a plurality of AND gates, each of said AND gates comprising a number of transistors, each having an emitter which is coupled to one of said OR gate outputs, a base for coupling to a second reference potential, and a collector, the transistor collectors in each AND gate being coupled together to form the output of said AND gate;
   a first plurality of input terminals coupled to a first group of inputs of said OR gates;
   a second plurality of control terminals coupled to a second group of inputs of said OR gates; and
   a third plurality of output terminals coupled to the outputs of said AND gates.

2. A programmable logic array as defined in claim 1 wherein:
   the transistors in each of said AND gates are fabricated with one AND gate collector region, one AND gate base region disposed in said AND gate collector region, and a plurality of AND gate emitter regions disposed in said AND gate base region.

3. A programmable logic array as defined in claim 2 wherein:
   each AND gate further includes a voltage clamp circuit and each AND gate output is coupled through said voltage clamp circuit to a third reference potential.

4. A programmable logic array as defined in claim 3 wherein:
   said voltage clamp circuit includes a diode and a resistor in a parallel connection.

5. A programmable logic array as defined in claim 4 wherein:
   said OR gate output current source is a resistor for coupling to a voltage source.

* * * * *